United States Patent [19]

Kurz et al.

[11] 3,812,518

[45] May 21, 1974

[54] PHOTODIODE WITH PATTERNED STRUCTURE

[75] Inventors: Bruno F. Kurz; Armand P. Ferro, both of Schenectady, N.Y.

[73] Assignee: General Electric Company, Schenectady, N.Y.

[22] Filed: Jan. 2, 1973

[21] Appl. No.: 320,583

[52] U.S. Cl. ....... 357/30, 317/235 R, 317/235 AM, 307/311, 250/211 J, 317/235 E

[51] Int. Cl. ........................................ H01l 15/00

[58] Field of Search..... 317/235 N, 235 AM, 235 E; 250/211 J; 307/311

[56] References Cited

UNITED STATES PATENTS

| | | | |
|---|---|---|---|
| 3,676,727 | 7/1972 | Dalton | 313/66 |
| 3,529,217 | 9/1970 | Van Santen | 317/235 |
| 3,549,960 | 12/1970 | Wedlock | 317/235 |
| 3,260,902 | 7/1966 | Porter | 317/235 |
| 3,423,527 | 1/1969 | Collins | 178/7.1 |

*Primary Examiner*—Martin H. Edlow
*Attorney, Agent, or Firm*—Donald R. Campbell; Joseph T. Cohen; Jerome C. Sequillaro

[57] ABSTRACT

A monolithic or discrete photodiode has a patterned region, preferably in the form of elongated strips or fingers, with a spacing less than the diffusion length to obtain low capacitance without loss of photo response. Enhanced efficiency is achieved by the use of surface skin regions and/or a buried layer to confine generated carriers, and by a structure that effects combination of the epitaxial layer-substrate photodiode with the finger photodiode. The low capacitance photodiode is sensitive to visible and infrared light and is useful in high speed circuit applications.

14 Claims, 7 Drawing Figures

PHOTODIODE WITH PATTERNED STRUCTURE

BACKGROUND OF THE INVENTION

This invention relates to an improved light sensitive semiconductor photodiode, and more particularly to low capacitance monolithic and discrete photodiodes with a patterned structure for high speed circuit applications.

Semiconductor photodiodes are being used in an increasing number of light coupled circuit applications especially in view of the availability of inexpensive light emitting diodes. Light sensitive photodiodes are among the fastest of the photodetectors and are frequently used in high speed circuit applications. Presently, monolithic silicon photodiodes are fabricated by a shallow *p*-diffusion into an *n*-epitaxial region, the *p*-diffusion normally covering the entire active area of the device. The junction capacitance and the generated photocurrent are proportional to this area. In order to increase sensitivity at low light levels, the area can be made larger. However, this also increases the capacitance of the device which in turn limits frequency response.

Special grated discrete photodiodes formed on high resistivity silicon substrate material (200 ohm-cm) have been used for very short wavelength detection. The grating spacing is determined by the resistivity and is less than the width of the depletion layer at zero volts reverse bias. The new patterned photodiode is suitable for fabrication in lower resistivity monolithic integrated circuit material (typically 1–3 ohm-cm), has an entirely different criteria for determining the pattern spacing and is responsive to light in the visible and infrared spectrum. Improved low capacitance discrete photodiodes are also made possible.

SUMMARY OF THE INVENTION

The improved low capacitance photodiode, in its monolithic implementation, is preferably fabricated by planar diffusion processing in a continuous layer of one conductivity type, such as an n-epitaxial layer, on a semiconductor substrate of the opposite conductivity type, such as a *p*-wafer. A plurality of spaced opposite conductivity type regions are formed into the surface of this layer, each providing a light sensitive junction therewith. The spacing of these *p*-regions is equal to or less than the diffusion length of carriers generated by incident light. Suitable means are provided for making contact to the layer and to the spaced regions for the application of a reverse biasing potential. The preferred pattern for the *p*-regions is a row of elongated strips or fingers. This structure achieves reduction of device capacitance due to the reduced junction area as compared to the illuminated area, without substantial loss of photo response because carriers generated by light incident on the *n*-layer between the *p*-regions and their depletion layers are collected.

A second embodiment achieves enhanced efficiency by a physical structure and circuit connection effecting combination of the underlying *n*-layer, *p*-substrate photodiode with the patterned or finger-structure photodiode. In the disclosed arrangement, a surrounding isolation *p*-region makes contact with the elongated finger structures and also with the substrate, and permits application of the same reverse biasing potential to both photodiodes. A surface *n*-skin can also be employed to prevent surface recombination. In another embodiment, a buried *n*-layer is provided to prevent carrier loss to the substrate. A discrete low capacitance photodiode device is based upon the same principles and preferably incorporates the surface *n*-skin. The improved photodiodes are sensitive to visible and infrared light, and are useful in a variety of high speed circuit applications.

DESCRIPTION OF THE PREFERRED EMBODIMENTS

The patterned or finger-structure monolithic photodiode is preferably made from silicon semiconductor material by conventional planar diffusion techniques. Within its broader scope, however, the invention can be practiced using other suitable semiconductor materials and fabrication processes. In the silicon integrated circuit chip (FIG. 1), a *p*-type substrate 10 has an overlying *n*-type layer 11 which becomes the *n*-region of the finger photodiode. Typically, as is well-known in the art, the substrate is a lightly doped *p*-wafer on which is grown a relatively thin, lightly doped *n*-epitaxial layer 11. Epitaxial layer 11 suitably has a resitivity of about 1–3 ohm-cm, a value that is common in the art and used for the fabrication of a variety of monolithic structures. In order to obtain low device capacitance, the new monolithic photodiode has a patterned *p*-region formed into the surface of the *n*-region 11 that covers a selected portion of the entire light irradiated, active area of the device. This is in contrast to prior conventional photodiodes in which a single *p*-region covers the entire active area of the device. The capacitance is also minimized by reverse biasing the pn photodiode, since the depletion layer is then the widest.

Figure 1:
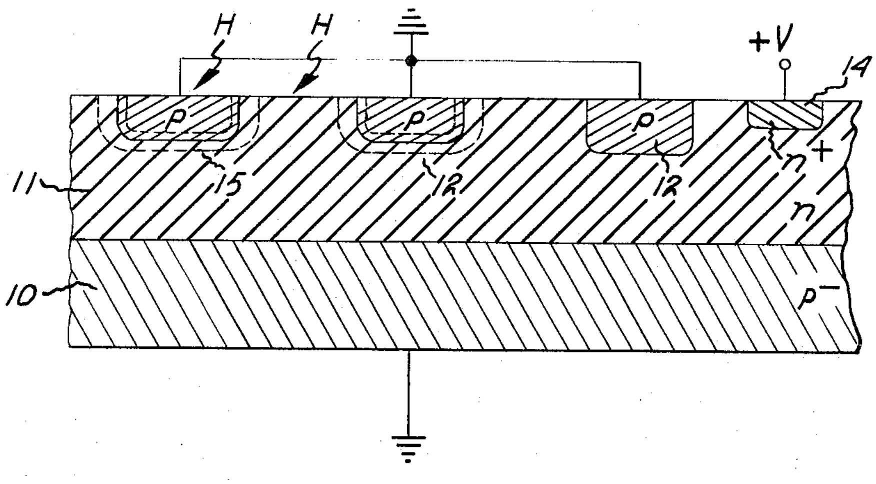
FIGS. 1 and 2 are diagrammatic cross sectional and plan views, respectively, of a low capacitance monolithic finger photodiode illustrating the principles of the invention.
Figure 2:
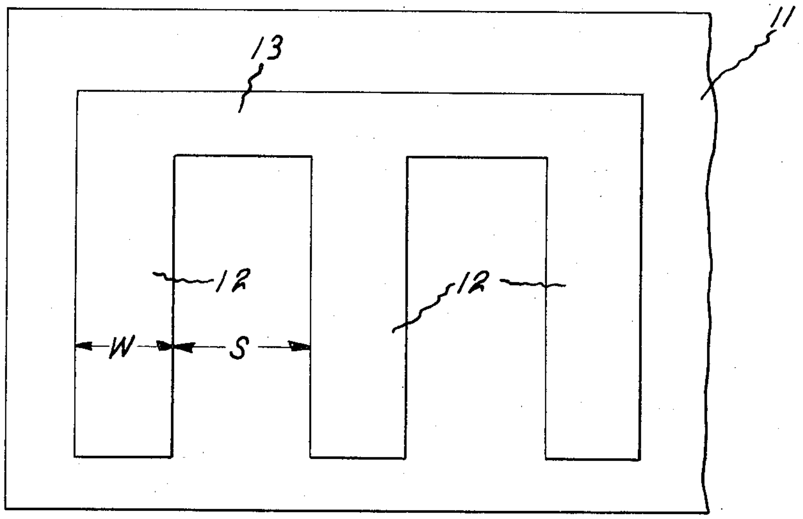

The preferred geometry for the patterned *p*-region, shown in FIGS. 1 and 2, is a plurality of elongated, spaced, parallel strips or fingers 12. The elongated strips 12 are shallow *p*-diffusions, each having a width w and a separation or spacing *s*. To make contact to the individual elongated strips 12 for the application of a common biasing potential, an additional orthogonally oriented *p*-strip 13 is provided connecting the ends of the elongated strips 12. The result is a comb-like structure. A suitable anode terminal contact is made to the connection strip 13, for example, by a deposited metallization. A cathode contact is also provided at one side of the device at the surface of *n*-epitaxial layer 11, preferably in the form of a heavily doped $n^+$-region 14. To reverse bias the photodiode, the anode terminal is commonly connected to ground potential while the cathode terminal is connected to a source of voltage +V. The boundaries of the depletion layer at the light sensitive pn junction formed between each *p*-region 12 and the *n*-layer 11 are indicated in dashed lines at 15.

To a first order the junction capacitance is proportional to the combined area of the finger-structure *p*-regions 12. Thus, when the combined area of *p*-region 12 is equal to one-third of the illuminated active area of the photodiode, the capacitance is reduced to one-third of the capacitance of a conventional plain photodiode in which the *p*-region covers the entire active area. In order to avoid reducing the carrier collection efficiency of the photodiode, a constraint on the finger-structure pattern is that the spacing s between the individual fingers 12, which can also be called the grating spacing, is equal to or less than the minority carrier diffusion length $L_D$. Photo energy H in the visible and infrared spectrum is incident not only upon the *p*-regions 12, but also upon the surface of *n*-layer 11 between these regions and their depletion layers, and the portion of the photon energy absorbed in these portions of *n*-layer 11 creates electron-hole pairs which must also be collected before recombination if the efficiency of the photodiode is not to suffer. The depletion region 12 is actually very small, however, it is understood that carriers formed within the depletion region are collected immediately. For *n*-epitaxial material having a resistivity of about 2 ohm-cm, a reasonable value of lifetime easily obtained in integrated circuit processing is 1 microsecond, and the diffusion length for this example is 1.4 mils. Since practical spacings in integrated circuit processing can be maintained down to 0.1 mil, reasonable values of finger widths w and spacings s are easily achieved in practice. The photocurrent resulting from a given radiation is proportional to the hole-electron pairs generated in the bulk layer 11 and collected at a pn junction. When the distance from any point in the *n*-layer 11 to a *p*-region 12 is approximately equal to or less than the diffusion length, the probability is that 70 percent of the carriers generated are collected.

By way of example, the width w of the fingers 12 is 1 mil and the spacing *s* is 2 mils. This may also be referred to as a grating structure in which s is the grating spacing. As was previously discussed, the device capacitance is one-third that of a conventional plain photodiode in which the *p*-region covers the entire active area. The generated photocurrent is only a small percentage below that of this equivalent plane photodiode. Thus, the new monolithic photodiode with a finger structure substantially decreases the device capacitance with little or no loss in photo response. In high speed applications of photodiodes, the ratio of photocurrent to capacitance is of prime importance. This ratio, which can be defined as a figure of merit, is higher for the finger photodiode than for the equivalent plain photodiode.

Figure 3:
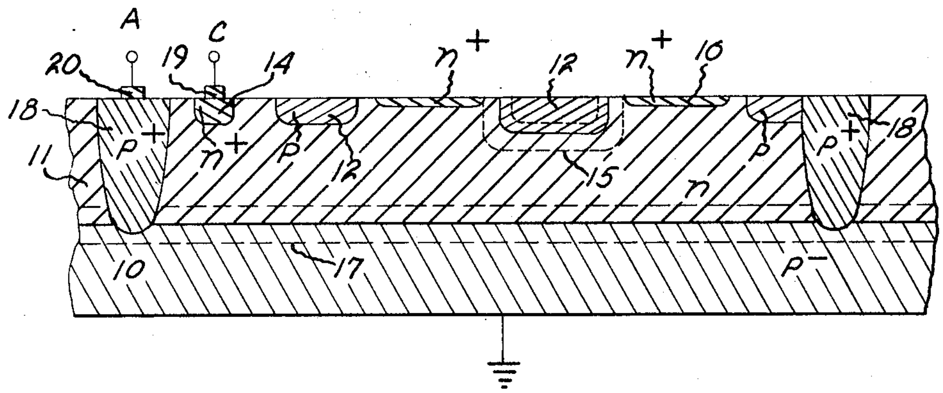
FIGS. 3 and 4 are cross sectional and plan views, respectively, of another embodiment with enhanced efficiency obtained by combination with the underlying light sensitive epitaxial-substrate diode.
Figure 4:
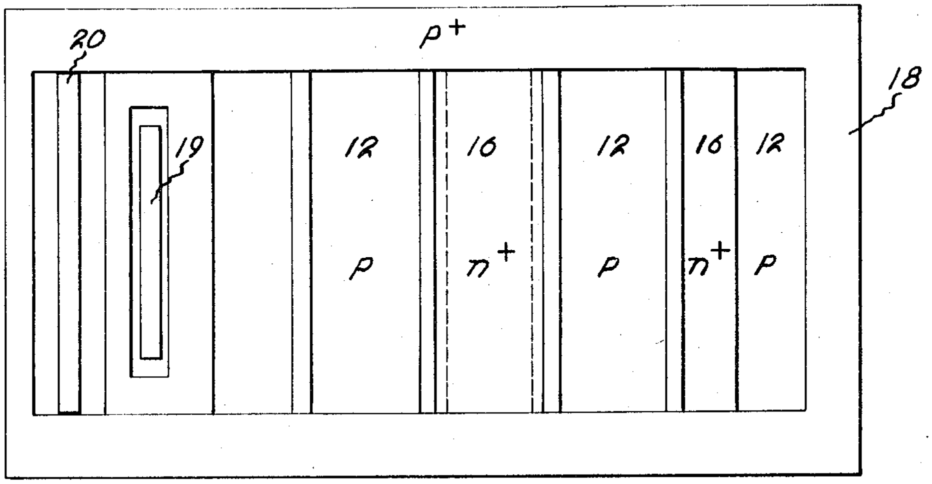

The second embodiment of the invention shown in FIGS. 3 and 4 achieves enhanced efficiency and has a very desirable circuit connection. One modification is the addition, at the surface of *n*-layer 11, of shallow, heavily doped $n^+$-regions or diffusions 16. There is a surface $n^+$-region 16 in the spacing between each adjacent pair of elongated *p*-strips 12, forming an interleaved or interdigitated structure. Since they may cover the entire area between p-regions 12, they may be referred to as an $n^+$ skin. Surface regions 16 create electric fields that tend to confine the minority carriers to high lifetime areas, namely the surrounded or nearly enclosed *n*-layer 11. Photo response is increased by preventing surface recombination.

Another feature to enhance the efficiency is the collection of carriers by the underlying photodiode provided by the junction of *n*-layer 11 and substrate *p*-layer 10. The n-epitaxial layer 11 is made sufficiently thin that electron-hole pairs are created throughout the entire layer by the absorbed photon energy. Desirably, the thickness of epitaxial layer 11 is less than the absorption coefficient of the wavelength of the light being used. For example, at 9,000 A, the absorption coefficient is 28 microns (32 percent of the light gets beyond 28 microns before absorption). For incident infrared light of this wavelength, the epitaxial layer is suitably 15 microns thick. Since substrate 10 is commonly at ground potential, the underlying np photodiode is also reverse biased and has a depletion layer for the collection of carriers whose boundaries are indicated at 17.

Contact is made to both the top-side light sensitive pn junction and the underlying light sensitive np junction by means of a surrounding $p^+$ isolation region 18. Isolation region 18 is a deep diffusion extending at least partially into substrate 10. One side of the hollow rectangular diffusion 18 is adjacent to and outside of the cathode contact $n^+$-region 14, while the other side can make connection to the endmost *p*-region 12. The other two sides of the rectangular diffusion 18, as can be seen in FIG. 4, abut and make connection to the ends of each of the *p*-regions or elongated strips 12. Isolation region 18 may also abut the interdigitated surface $n^+$-regions 16. A metallization 19, typically aluminum, is deposited on the $n^+$-region 14 to make connection to the cathode terminal, and in similar fashion a metallization 20 is deposited on the adjacent side of isolation region 18 for connection to the anode terminal of the device. To reverse bias both photodiodes, the anode terminal is connected to ground potential and the cathode terminal to a positive voltage.

Figure 5:
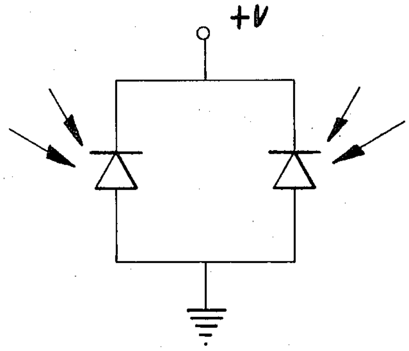
FIG. 5 is a schematic circuit diagram of the photodiode connection effected by the arrangement in FIGS. 3 and 4.

FIG. 5 shows the desirable electrical connection for enhanced efficiency of a monolithic photodiode obtained by the photodiode structure of FIGS. 3 and 4. The *n*-epitaxial, *p*-substrate junction is used to augment the photo response of the low capacitance finger photodiode. One application of this photodiode structure in a high speed integrated photodetector is described in the concurrently filed allowed application of John D. Harnden, Jr., Armand P. Ferro, and Bruno F. Kurz, Ser. No. 320,568, assigned to the same assignee as this invention.

Figure 6:
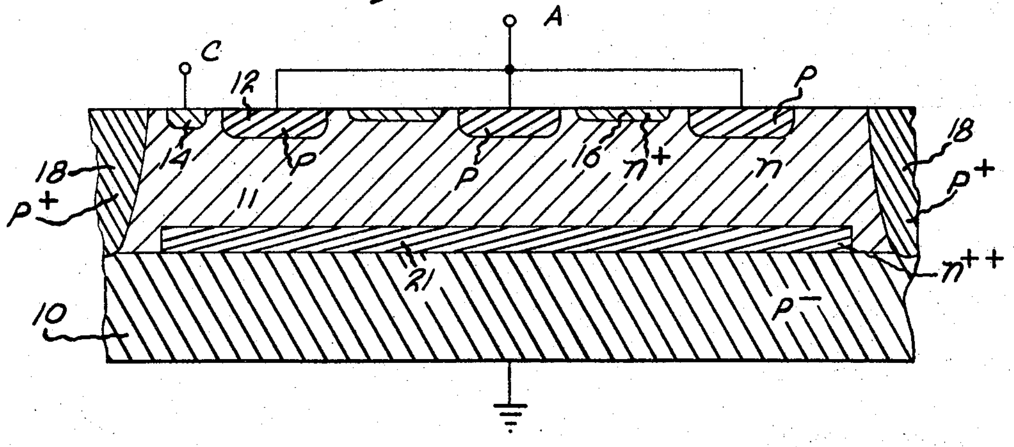
FIG. 6 is a cross sectional view of a third embodiment with enhanced efficiency obtained by the addition of a buried layer to confine the generated carriers.

The third embodiment illustrated in FIG. 6 utilizes a buried $n^{++}$ layer to achieve enhanced efficiency. This form of the invention is a modification of FIG. 1, with the addition of the heavily doped $n^{++}$ buried layer 21 between the substrate 10 and the *n*-epitaxial layer 11. The built-in electric field of the buried layer helps to confine the generated carriers inside the *n*-epitaxial layer. Accordingly, there are reduced carrier losses into the substrate. Although the $p^+$ isolation region 18 is shown, there is no connection to the anode terminal as in FIGS. 3–5.

Figure 7:
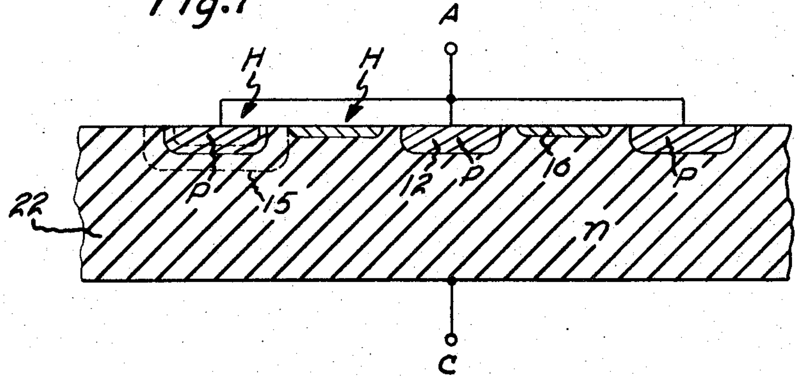
FIG. 7 is a diagrammatic cross sectional view of a discrete, light sensitive, low capacitance photodiode based on the same principles.

The invention is also applicable to provide improved discrete, low capacitance light sensitive photodiodes, commonly known as solar cells. Referring to FIG. 7, the elongated strips 12 diffused into the surface of *n*-region or *n*-layer 22, which has a resistivity up to 10 ohm-centimeter, are again spaced a distance equal to or less than the diffusion length to obtain low device capacitance without significant loss of photo response. The cathode terminal contact is, of course, made to the opposite side of *n*-layer 22. The use of the surface $n^+$ regions 16 is preferred since surface recombinatins can be a problem in solar cells. The use of a spiral p-region pattern, in which adjacent strips are separated by a diffusion length, may be preferred, or a polka-dot pattern in which the "dots" are circles with a diameter equal to the diffusion length.

The foregoing different forms of the invention, as has been mentioned, are preferably manufactured by standard planar diffusion processing using doping levels, impurity materials, masking techniques, etc., that are well known in the art and need not be further discussed. While the finger structure for the patterned *p*-diffusion is the preferred geometry, within the broader scope of the invention, the *p*-diffusion can be made with squares, circles, or some other geometry, as has been mentioned, subject to the limitation that the individual diffused regions are separated by a distance that does not exceed the diffusion length. A high speed, low capacitance patterned photodiode has utility in a variety of light-coupled or light-receiver circuits, particularly in the consumer and commercial fields, including such apparatus as an intrusion alarm, a smoke detector, a photoelectric relay, a counter, an SCR gate drive, etc. Reference may be made, for example, to U.S. Pat. No. 3,534,351, granted Oct. 13, 1970, and to the previously mentioned concurrently filed application Ser. No. 320,568.

In summary, a photodiode with a patterned or finger structure has low capacitance with little or no loss in photo response and is useful in high speed applications. Enhanced efficiency is obtained by techniques such as using surface regions and buried layers for improved carrier collection and by an advantageous structure and circuit connection in which the underlying *n*-layer, *p*-substrate junction is used to augment the photo response of the patterned photodiode.

While the invention has been particularly shown and described with reference to several preferred embodiments thereof, it will be understood by those skilled in the art that various changes in form and details may be made therein without departing from the spirit and scope of the invention.

What is claimed as new and desired to be secured by letters Patent of the United States is:

1. A low capacitance photodiode comprising
a semiconductor layer of one conductivity type,
a plurality of spaced opposite conductivity type regions formed into the surface of said layer each providing a light sensitive junction therewith, and
means for making contact to said layers and to said spaced regions for the application of a reverse biasing potential, thereby forming a depletion region at each light sensitive junction,
said spaced regions being spaced from one another by a distance on the order of the diffusion length of carriers generated in said layer by incident visible and infrared light, to thereby collect carriers generated by light incident on the surface of said layer between said depletion regions.

2. A photodiode according to claim 1 further including other regions with the same conductivity type as said layer formed into the surface thereof between said spaced opposite conductivity type regions to prevent surface recombination of said generated carriers.

3. A monolithic photodiode comprising
a semiconductor layer of one conductivity type on a substrate of the opposite conductivity type,
a plurality of spaced opposite conductivity type regions formed into the surface of said layer each providing a light sensitive junction therewith having a narrow depletion layer, said regions being spaced from one another by a distance less than the diffusion length of carriers generated in said layer by incident visible and infrared light, and
means for making contact to said layer and to said spaced regions for the application of reverse biasing potential.

4. A photodiode according to claim 3 wherein said spaced regions are in the form of elongated strips arranged parallel to one another.

5. A photodiode according to claim 3 further including other regions with the same conductivity type as said layer formed into the surface thereof between said spaced opposite conductivity type regions to prevent surface recombination of said generated carriers.

6. A photodiode according to claim 3 further including an additional opposite conductivity region extending through said layer and connecting to said substrate to collect generated carriers at an underlying light sensitive junction between said layer and substrate, and
means for making contact to said additional region for the application of the reverse biasing potential.

7. A photodiode according to claim 3 wherein said means for making contact to said spaced regions includes an opposite conductivity type isolation region surrounding said spaced regions.
said isolation region also connecting to said substrate to collect generated carriers at an underlying light sensitive junction between said layer and substrate to which the reverse biasing potential is also applied.

8. A photodiode according to claim 3 further including a buried layer between said first-mentioned layer and substrate, having the same conductivity type as said first-mentioned layer and tending to confine said generated carriers thereto.

9. A monolithic photodiode comprising
an *n*-type layer on a p-type semiconductor substrate,
a plurality of spaced elongated *p*-type strips formed into the surface of said layer and each providing a light sensitive junction therewith having a narrow depletion region, said elongated strips being spaced from one another by a distance less than the diffusion length of carriers generated in said layer by incident visible and infrared light, and
first contact means for making connection to said spaced elongated strips, and second contact means making connection to said layer for the application of a reverse biasing potential.

10. A photodiode according to claim 9 further including other shallow n-type regions formed into the surface of said layer between said spaced elongated strips to prevent surface recombination of said generated carriers.

11. A photodiode according to claim 9 wherein said first contact means comprises a *p*-type isolation region having connection to the ends of said spaced elongated strips, said isolation region extending through said layer and connecting to said substrate to collect generated carriers at an underlying reverse-biased light sensitive junction between said layer and substrate.

12. A photodiode according to claim 9 wherein said first contact means comprises a p-type isolation region entirely surrounding said spaced elongated strips and second contact means and making connection to the ends of said spaced elongated strips, said isolation region extending through said layer and connecting to said substrate to collect generated carriers at an underlying reverse-biased light sensitive junction between said layer and substrate.

13. A photodiode according to claim 7 further including a buried *n*-type layer between said first-mentioned layer and substrate that tends to confine said generated carriers to said first-mentioned layer.

14. A photodiode according to claim 9 further including other shallow n-type regions formed into the surface of said layer between said spaced elongated strips to prevent surface recombination of said generated carriers, and a buried n-type layer between said first-mentioned layer and substrate that tends to confine said generated carriers to said first-mentioned layer.

* * * * *